(12) United States Patent
Chen

(10) Patent No.: US 6,784,483 B2
(45) Date of Patent: Aug. 31, 2004

(54) METHOD FOR PREVENTING HOLE AND ELECTRON MOVEMENT IN NROM DEVICES

(75) Inventor: Chien-Wei Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 106 days.

(21) Appl. No.: 10/236,023

(22) Filed: Sep. 4, 2002

(65) Prior Publication Data

US 2004/0043622 A1 Mar. 4, 2004

(51) Int. Cl.[7] .............................................. H01L 29/788
(52) U.S. Cl. ...................... 257/317; 257/324; 257/315
(58) Field of Search ................................ 257/314–327

(56) References Cited

U.S. PATENT DOCUMENTS

| | | | | |
|---|---|---|---|---|
| 5,338,954 A | * | 8/1994 | Shimoji ........................ 257/326 |
| 5,349,222 A | * | 9/1994 | Shimoji ........................ 257/326 |
| 5,452,248 A | * | 9/1995 | Naruke et al. .......... 365/185.18 |
| 5,838,041 A | * | 11/1998 | Sakagami et al. ........... 257/324 |
| 5,883,406 A | * | 3/1999 | Nishizawa ................... 257/264 |
| 6,191,459 B1 | * | 2/2001 | Hofmann et al. ............ 257/390 |
| 6,436,800 B1 | * | 8/2002 | Kuo et al. .................... 438/558 |
| 6,501,681 B1 | * | 12/2002 | Van Buskirk et al. .. 365/185.22 |
| 6,574,144 B2 | * | 6/2003 | Forbes ................... 365/185.18 |
| 6,645,801 B1 | * | 11/2003 | Ramsbey et al. ............ 438/216 |
| 6,664,588 B2 | * | 12/2003 | Eitan ........................... 257/316 |
| 6,706,575 B2 | * | 3/2004 | Fan et al. ..................... 438/197 |
| 6,707,078 B1 | * | 3/2004 | Shiraiwa et al. ............. 257/208 |
| 6,713,332 B2 | * | 3/2004 | Chung ......................... 438/197 |

* cited by examiner

Primary Examiner—Michael Lebentritt
(74) Attorney, Agent, or Firm—Stout, Uxa, Buyan & Mullins, LLP

(57) ABSTRACT

Nonvolatile memory devices, such as NROM devices that have an oxide-nitride-oxide (ONO) layer beneath at least one word line structure, and methods for making same, are disclosed. The ONO layer is formed on a substrate, followed by a patterned photoresist layer being formed on the ONO layer. The patterned photoresist layer then serves as an implanting mask to form at least one bit line in the substrate, followed by a material layer being formed on the substrate. The material layer is planarized until the photoresist layer is exposed, and the photoresist layer is then removed. A polymer layer is formed, using a dielectric resolution enhancement coating technique, on exposed surfaces of the material layer, with the polymer layer serving as an etching mask to define the top oxide layer and the nitride layer of the ONO layer. The polymer layer and the material layer are then removed.

4 Claims, 11 Drawing Sheets

METHOD FOR PREVENTING HOLE AND ELECTRON MOVEMENT IN NROM DEVICES

BACKGROUND OF THE INVENTION

1. Field of the Invention

The present invention relates to non-volatile memory devices and, more particularly, to non-volatile memory devices having two bits per cell.

2. Description of Related Art

A non-volatile semiconductor memory device is designed to maintain programmed information even in the absence of provided power. The read-only memory (ROM) is a non-volatile memory device commonly used in electronic equipment such as microprocessor-based digital electronic equipment and portable electronic devices such as cellular phones.

ROM devices are conventionally arranged into a plurality of memory cell arrays. Each memory cell includes a transistor, which typically comprises a metal-oxide-semiconductor field effect transistor (MOSFETs) that is juxtaposed between two intersecting bit lines and a word line. Data bit values or codes held by these memory cell transistors are permanently stored (until deliberate erasure) in the physical or electrical properties of the individual memory cells. Generally speaking, a consequence of the non-volatile nature of a ROM is that data stored in the memory device can only be read.

A relatively recent development in non volatile memory has been the advent of Nitride Read-Only Memory (NROM) devices. NROM devices offer a number of advantages over the 30 year old currently dominant floating gate devices such as EPROM, Flash, and EEPROM, which store charge in a conductive floating gate.

NROM cells can comprise 2 bit flash cells based on charge storage in an Oxide-Nitride-Oxide (ONO) dielectric. The NROM cell may comprise an n-channel MOSFET device wherein nitride is used as a trapping material between a top and bottom oxide. The ONO structure replaces the gate dielectric that is used in floating gate devices. The top and bottom oxide layers should be thicker than 50A to prevent any oxide damaging direct electron tunneling during programming.

NROM flash blocks may be added to standard CMOS processes by laying down the ONO layer after the field isolation but before the gate oxidation. Adding the NROM components typically has minimal effects on the CMOS thermal budgets. The NROM memory cells can be programmed by channel hot electron (CHE) injection, and erased by tunneling enhanced hot hole (TEHH) injection through the bottom oxide. The NROM cells operate as localized charge storage devices, which allows the trapped charge to remain only at the injection point. Thus, single bit failures commonly experienced by floating gate technologies may be reduced. This reduction may allow for further minimization of device size and increased device density without degradation in performance.

NROM devices can offer a number of significant advantages over floating gate devices. Both the bit size and the die size can be a factor of 3 or more smaller for NROM devices. NROM devices can also require 6 to 8 fewer photomask steps, their process complexity can be simpler, and it can be easier to integrate them with CMOS devices for embedded applications. Furthermore, NROM devices can be more suited to low voltage product implementation due to a lower erased threshold voltage. However, a common problem with NROM devices can be the lateral movement of holes and electrons between the two bits in NROM cells. Such lateral movement of holes and electrons (commonly known as cross-talk) can occur, especially after certain thermal processes.

SUMMARY OF THE INVENTION

The present invention relates to nonvolatile memory devices and methods of forming such nonvolatile memory devices. More particularly, the invention herein provides improved methods of manufacturing NROM memory devices. The improved processing methods may reduce the occurrence of electron movement and/or hole movement between bits in an NROM memory cell. Such electron and/or hole movement, otherwise known as cross-talk, can occur especially after certain thermal processes. In accordance with an aspect of the present invention, cutting the nitride layer of the ONO stack in each cell can attenuate or eliminate this problem of cross-talk between two bits of a memory cell. The invention provides a dielectric resolution enhancement coating technique to facilitate cutting of the nitride layer. The dielectric resolution enhancement coating technique can overcome photolithography limitations of patterning the ONO stack below dimensions around 0.15 $\mu$m. Using a dielectric resolution enhancement coating technique in accordance with the present invention can allow for device dimensions which are smaller than the wavelength of the UV radiation used to pattern the photoresist and create the devices.

In accordance with an aspect of the present invention, a method for forming at least one nonvolatile memory device comprises providing a substrate with a trapping layer and photoresist features formed thereon; using the photoresist features as an implanting mask to form at least one bit line; forming a material layer between the photoresist features; removing the photoresist features; forming a polymer layer on surfaces of the material layer; and using the polymer layer as an etching mask to define the trapping layer.

In accordance with another aspect of the present invention, a method for forming a nonvolatile memory device can comprise forming a trapping layer on a prepared substrate; forming a patterned photoresist layer on the trapping layer; using the photoresist layer as an implanting mask to perform an implantation to form at least one bit line; forming a material layer on surfaces of the photoresist layer and trapping layer; planarizing the material layer to expose the photoresist layer; removing the photoresist layer; forming a polymer layer on surfaces of the material layer; using the polymer layer as an etching mask to pattern the trapping layer into at least one trapping layer strip; removing the material layer and the polymer layer; and forming at least one word line on the at least one trapping layer strip.

The trapping layer may comprise in sequence a first oxide layer, a nitride layer, and a second oxide layer, wherein the first oxide layer, the nitride layer, and the second oxide layer form an ONO stack. The ONO stack may be patterned such that the first oxide layer remains substantially unpatterned. The material layer may comprise a bottom anti-reflective coating (BARC) layer. The polymer layer that is formed on the material layer may be formed in an etcher. The step of planarizing the material layer may comprise an etch back process. The at least one bit line may comprise a plurality of bit lines, the at least one trapping layer strip may comprise a plurality of trapping layer strips, and the at least one word line may comprise a plurality of word lines.

In accordance with yet another aspect of the present invention, a method for forming a nonvolatile memory on a semiconductor substrate can comprise the steps of providing a prepared semiconductor substrate; forming a trapping layer on the semiconductor substrate; applying and patterning a photoresist over the trapping layer to form a plurality of photoresist strips; selectively implanting the semiconductor substrate to form a plurality of bit lines; forming a material layer on surfaces of the patterned photoresist and trapping layer; planarizing the material layer to expose the photoresist layer; removing the photoresist layer; forming a polymer layer on surfaces of the material layer; etching back portions of the trapping layer to form a plurality of trapping layer strips; removing the material layer and the polymer layer; and forming a plurality of word lines.

The implanting step can be followed by a step in which the trapping layer is patterned into a plurality of dual trapping layer strips. The trapping layer may comprise in sequence a first oxide layer, a nitride layer, and a second oxide layer, forming an ONO stack. The second oxide layer formed in the foregoing method may consume some portion of the nitride layer during its growth. The polymer layer can be formed using a dielectric resolution enhancement coating technique, which may be performed in an etcher. The polymer layer may be used as an etch mask to protect the underlying layers during etch processing.

In accordance with one aspect of the present invention, a nonvolatile memory device comprises a prepared semiconductor substrate in which a plurality of bit lines are implanted. The nonvolatile memory device comprises a plurality of trapping layer block structures, and a plurality of word lines positioned over corresponding members of the plurality of trapping layer block structures. The trapping layer block structures are separated from one another in the word line direction at locations between the bit lines. Each trapping layer block structure corresponds to a single bit in a memory cell. The plurality of trapping layer block structures may comprise an oxide layer and a nitride layer.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

DETAILED DESCRIPTION OF PRESENTLY PREFERRED EMBODIMENTS

Figure 1:
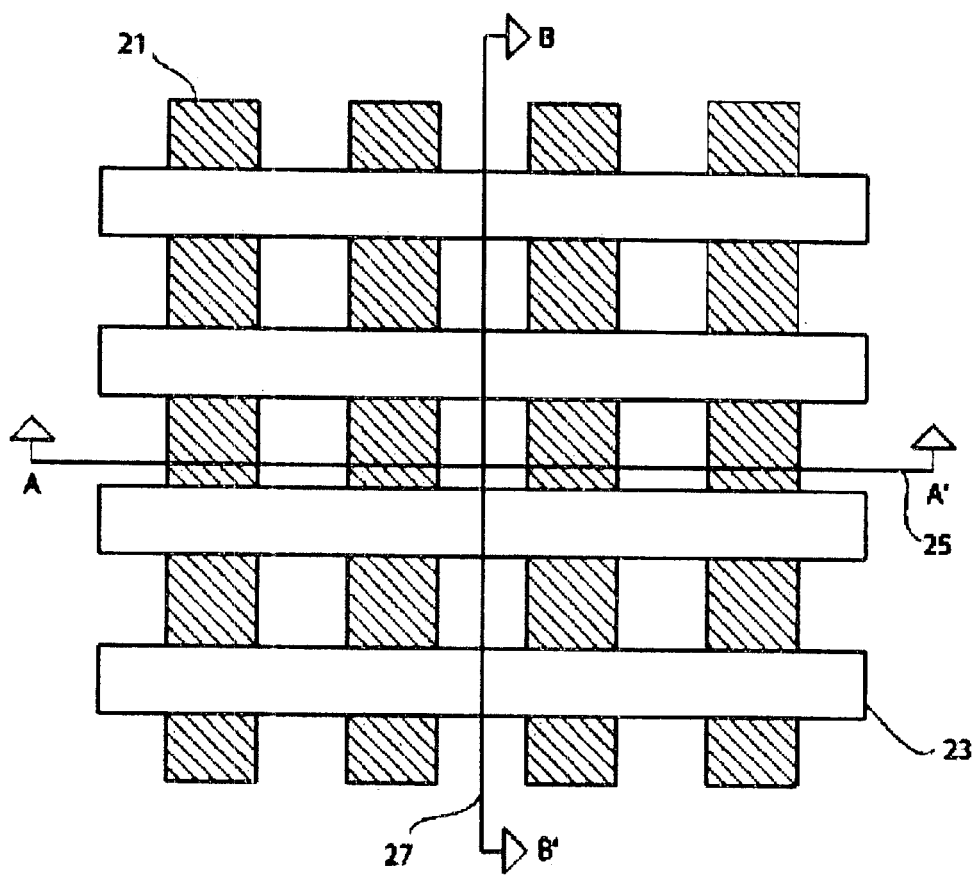
FIG. 1 is a plan view of an NROM semiconductor device after the formation of word lines and bit lines.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. For example, it is understood by a person of ordinary skill practicing this invention that NROM device technology can be used to replace the floating gate technologies of nonvolatile memory devices such as EPROM, Flash, and EEPROM with their NROM counterparts.

It is to be understood and appreciated that the process steps and structures described herein do not cover a complete process flow for the manufacture of NROM memory devices. The present invention may be practiced in conjunction with various integrated circuit fabrication techniques that are conventionally used in the art, and only so much of the commonly practiced process steps are included herein as are necessary to provide an understanding of the present invention.

Referring more particularly to the drawings, FIG. 1 illustrates a plan view of a plurality of bit lines 21 orthogonally disposed relative to a plurality of word lines 23. The plurality of bit lines 21 and plurality of word lines 23 may be fabricated on a semiconductor substrate (e.g., doped silicon) alongside customary complementary metal oxide semiconductor (CMOS) devices on the same chip or die. Standard initial CMOS processes are used to prepare the substrate for the application of NROM cells, including for example, field oxidation and well implant steps.

A portion of line A–A' 25, extending orthogonally to the plurality of bit lines 21 over a region not defined by one of the plurality of word lines 23, corresponds to the zoomed in cross-sectional views of FIGS. 2 through 9 and FIGS. 14 and 15. Likewise, a portion of line B–B' 27, extending orthogonally relative to the plurality of word lines 23 over a region not defined by one of the plurality of bit lines 21, corresponds to the zoomed in cross-sectional views of FIGS. 11 and 12.

Figure 2:
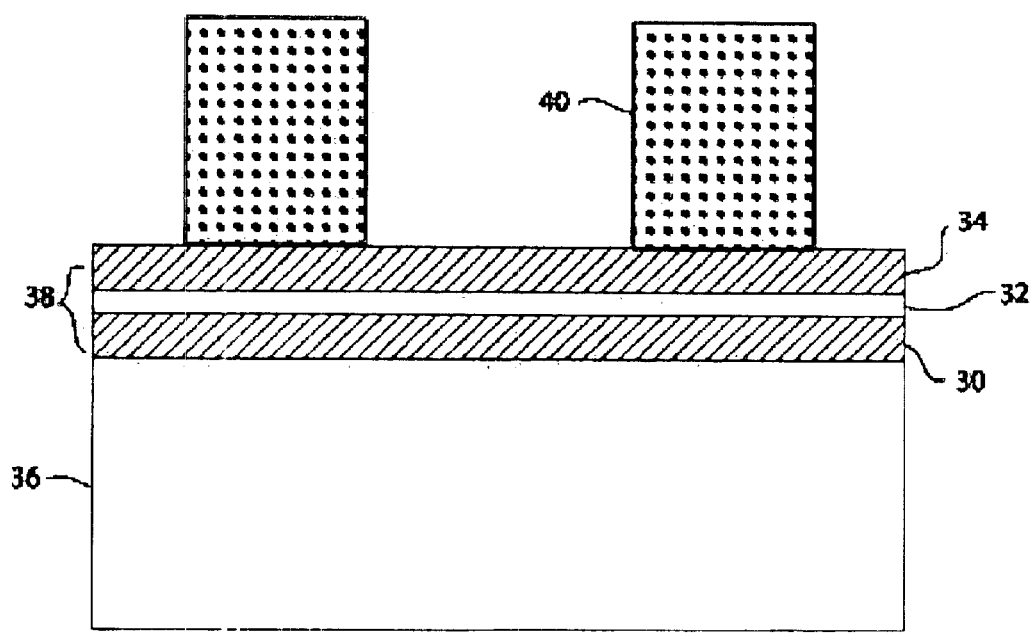
FIG. 2 is a cross-sectional view of an NROM semiconductor device in an intermediate processing step.

Referring now to FIG. 2, a trapping layer, which preferably comprises a first oxide layer 30, a silicon nitride layer 32, and a second oxide layer 34 has been deposited and/or grown over a prepared substrate 36. Although the substrate 36 preferably comprises a silicon wafer, in alternative embodiments the substrate 36 can comprise materials such as gallium nitride (GaN), gallium arsenide (GaAs), or other materials commonly recognized as suitable semiconductor materials to those skilled in the art.

The first oxide layer 30 and the second oxide layer 34 should be thick enough to prevent the occurrence of electron tunneling between trapped electrons in the nitride layer 32 and one of the plurality of bit lines 21 or plurality of word lines 23, which may occur at thicknesses below around 50 angstroms (A). Preferably, the first oxide layer 30 is grown or deposited to a thickness of about 50 to 100 A, the nitride layer 32 is deposited to a thickness of between about 35 and 75 A, and the second oxide layer 34 is grown or deposited to a thickness of about 50 to 150 A.

If the second oxide layer 34 is grown over the nitride layer 32 rather than deposited, then some portion of the nitride layer 32 is consumed in the formation of the oxide at approximately the rate of 1 A of nitride consumed to 2 A of oxide formed. Thus, the nitride layer 32 must be deposited to the desired thickness of 35 to 75 A plus half the desired thickness of the second oxide layer 34. For example, if it is desired for the second oxide layer 34 to have a thickness of 150 A, and for the nitride layer 32 to have a thickness of 50 A, then the nitride layer 32 must initially be deposited to a thickness of 125 A (50A+75A).

The first oxide layer 30, nitride layer 32, and second oxide layer 34 define an oxide-nitride-oxide (ONO) stack 38. The ONO stack 38 acts to trap charge within the nitride layer 32, which is electrically isolated by the second oxide layer 34 and the first oxide layer 30.

A photoresist layer 40, which may be either positive or negative photoresist, is applied to the ONO stack 38. The photoresist layer 40 is patterned and developed using common photolithographic processes, forming a pattern of photoresist features extending perpendicularly into the page, as shown in FIG. 2. As is common in the art, a layer of photoresist is first spun onto the wafer. The wafer is then placed into a stepper (photolithography tool for patterning wafers) where it is aligned to a mask and exposed to ultraviolet (UV) radiation. The mask may only be large enough to cover a small portion of the wafer, in which case the stepper steps the wafer through many quadrants, each of them being exposed in turn, until the entire or desired portion of the wafer has been exposed to UV light. The wafer is then placed into a chemical bath that dissolves the photoresist which was exposed to the UV radiation, to thereby yield a patterned photoresist layer 40 consisting of photoresist features. An exemplary spacing between features of the photoresist layer 40, using a conventional photolithographic process and a wavelength of for example about 248 nm, can be about 1300 A to about 3000 A.

Figure 3:
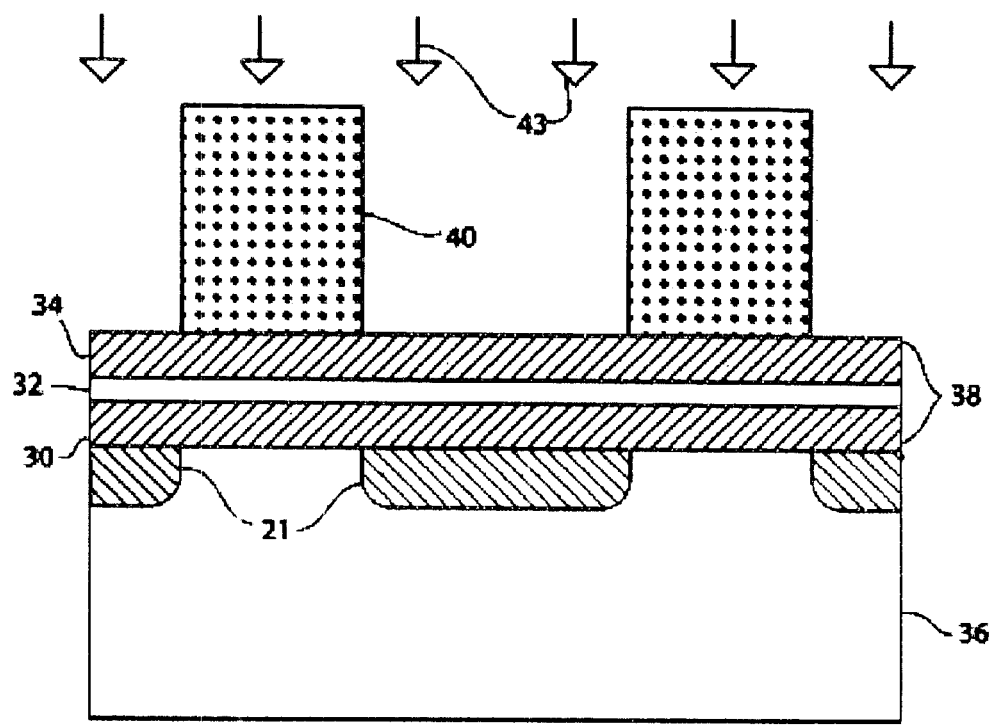
FIG. 3 is the cross-sectional view of FIG. 2 after a subsequent implant step.

As in FIG. 3, a dopant 43 such as arsenic or phosphorous is introduced into the exposed portions of the prepared substrate 36 by ion implantation to form source and drain regions, or a plurality bit lines 21. The implantation occurs through the ONO stack 38, which may prevent the occurrence of ion channeling by providing a surface to implant through that does not follow the lattice structure of the underlying substrate.

Figure 4:
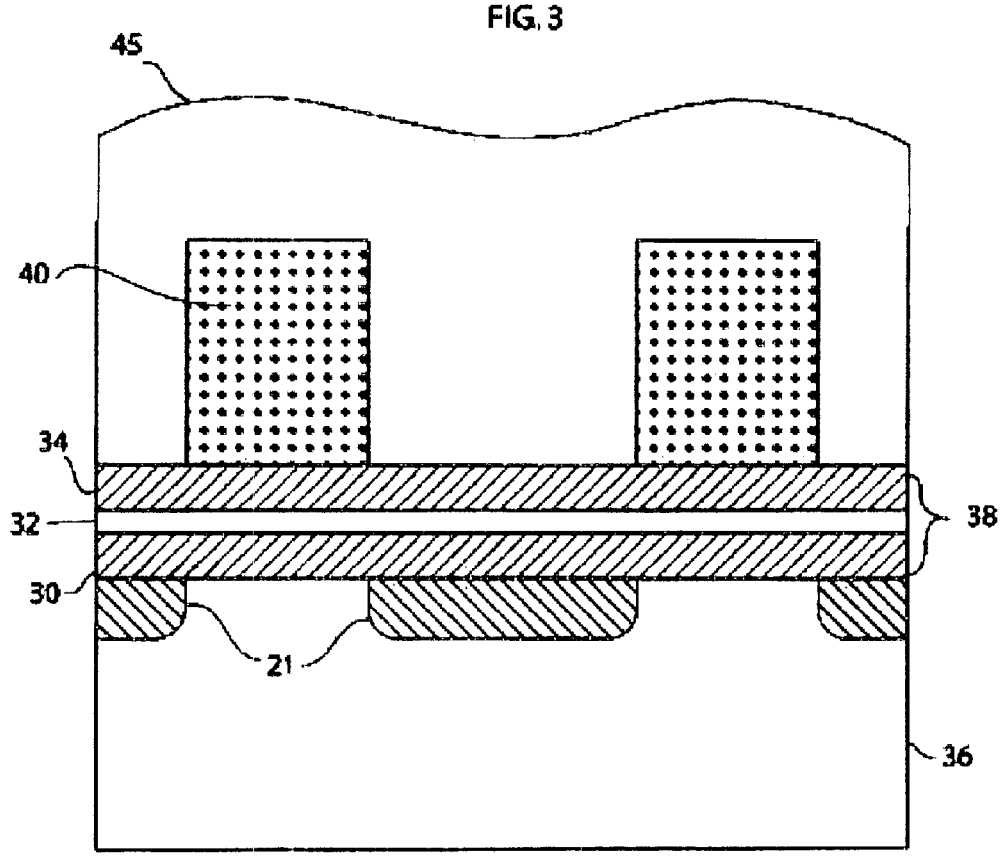
FIG. 4 is the cross-sectional view of FIG. 3 with the addition of a material layer.

Proceeding to FIG. 4, a material layer 45 is formed on the surfaces of the photoresist layer 40 and the ONO stack 38. The material layer 45 may comprise, for example, an anti-reflective coating such as an organic bottom anti-reflective coating (BARC) layer. BARC is typically used beneath photoresist layers during patterning processes to absorb most of the radiation penetrating the photoresist, thus reducing reflective notching, standing wave effects and scattering of the radiation. However, in accordance with an aspect of the present invention, the BARC layer is used not to facilitate such patterning, but rather is used to facilitate a dielectric resolution enhancement coating technique. The BARC can be deposited over photoresist layer 40 and the ONO stack 38 in an amount great enough to form a somewhat planar surface. For example, the BARC should extend above the photoresist layer 40 sufficiently to permit planarization of BARC without adversely affecting the photoresist layer 40.

Figure 5:
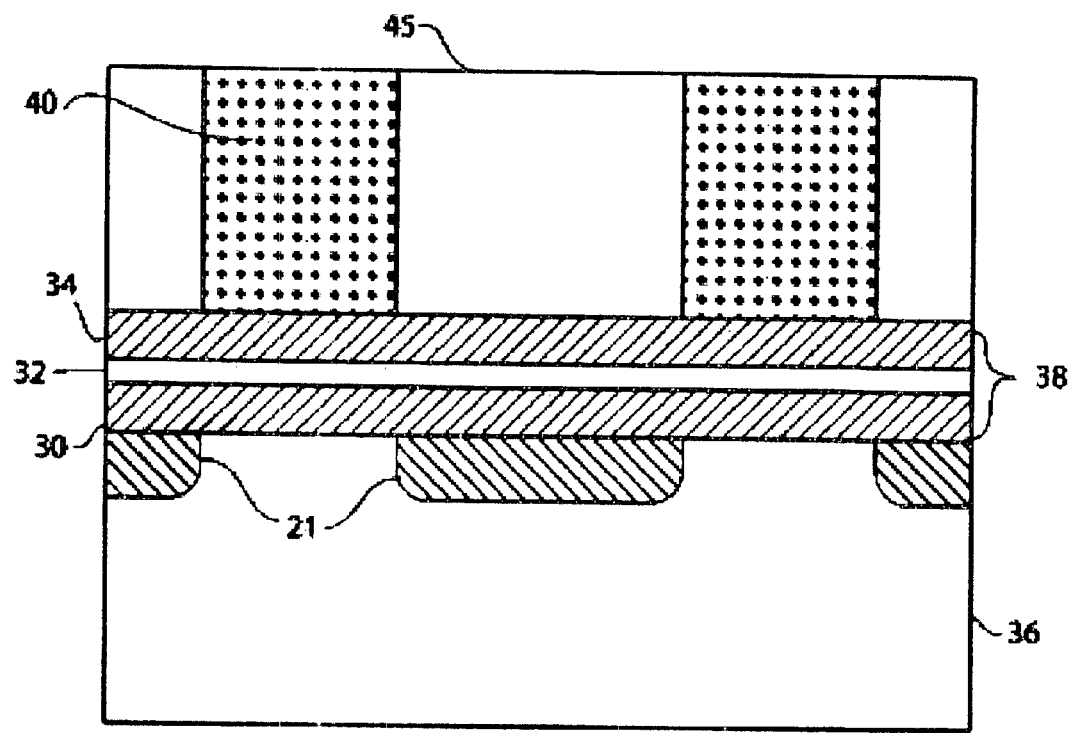
FIG. 5 is the cross-sectional view of FIG. 4 after a subsequent planarization process step.

As illustrated in FIG. 5, the material layer 45 is planarized until the photoresist layer becomes exposed. The planarization may be performed using an etch back process.

Figure 6:
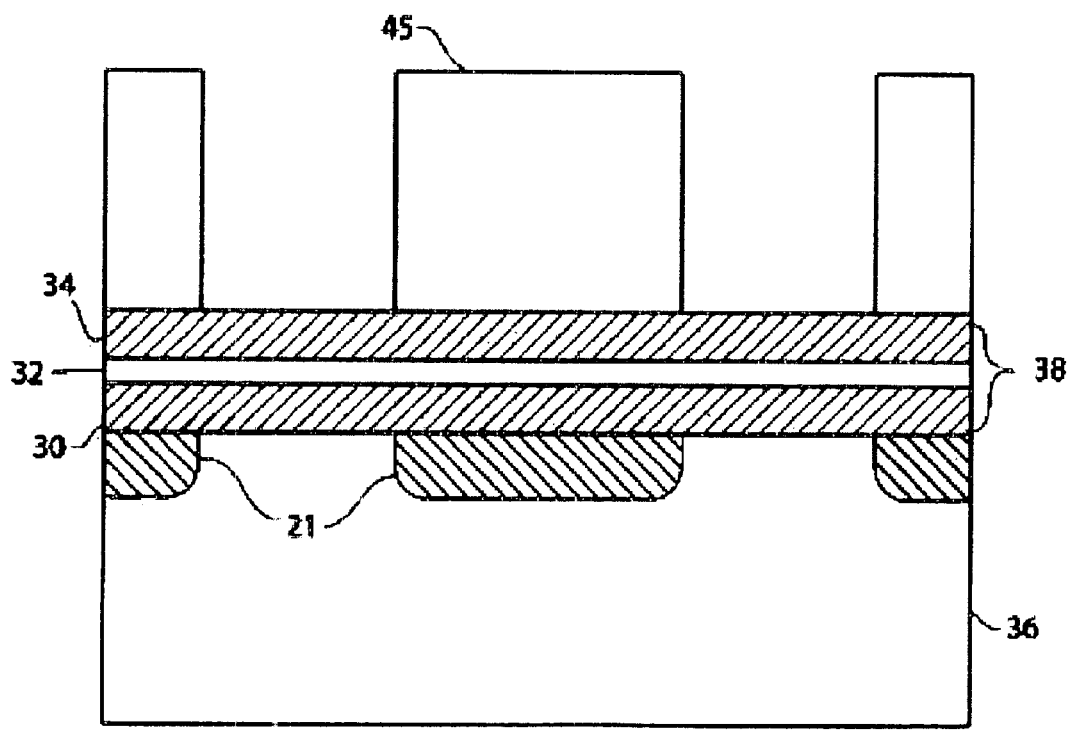
FIG. 6 is the cross-sectional view of FIG. 5 after all photoresist has been removed.

In the configuration of FIG. 6, the photoresist layer 40 has been selectively removed, leaving the material layer 45 intact. Different processing steps can be implemented for the removal of the photoresist layer 40 depending on the makeup of the material layer 45 so as not to adversely alter the material layer 45 structure or composition. The photoresist layer 40 can generally be removed via a selective wet etch process that removes a substantial amount (e.g., all) of the material of the photoresist layer 40, and does not remove a substantial amount of the material of the remaining portions of the material 45. In an embodiment wherein the material layer 45 is a BARC layer, the photoresist layer 40 can be removed with an exposure process followed by a develop process.

Figure 7:
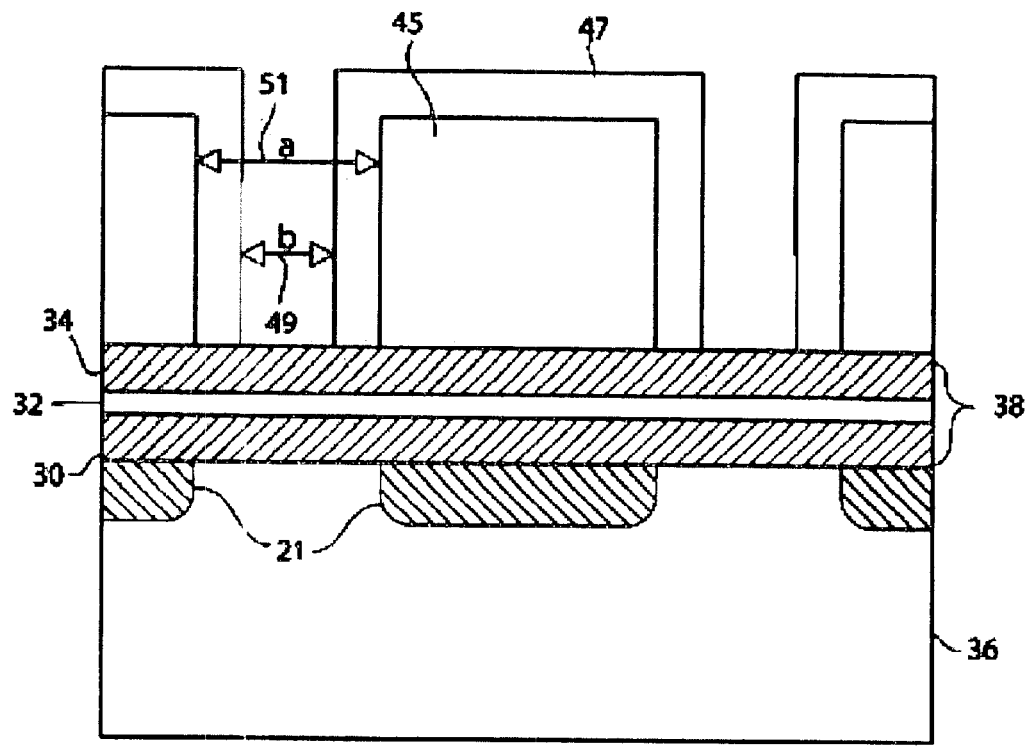
FIG. 7 is a cross-sectional view showing the device of FIG. 6 with the addition of a polymer.

Turning to FIG. 7, polymer layers 47 have been formed over exposed surfaces of the material layer 45. In a preferred embodiment, the polymer layers 47 are formed using a dielectric resolution enhancement coating technique performed in an etcher. The polymer layers 47 can be formed using, for example, the methods and apparatus disclosed in commonly-assigned, co-pending U.S. application Ser. No. 09/978,546, filed Oct. 18, 2001, U.S. application Ser. No. 10/145,203, filed May 13, 2002 and U.S. application Ser. No. 10/178,795 filed Jun. 24, 2002, in whole or in part to the extent compatible. In the illustrated embodiment, the polymer layers 47 comprise carbon fluoride and are formed to a top thickness of 0 to about 1000 A and a side thickness of about 500 A to about 1000 A. Although the top thickness and the side thickness can be varied relative to one another, they are formed to be about the same in one embodiment. The polymer layer may have a thickness such that a distance "b" 49 is less than a distance "a" 51. The distance "a" 51 is, for example, 1300–3000 A, and the distance "b" 49 is, for example, 300–1000 A. Regarding formation of the polymer layers 47, an etcher can be utilized in combination with a recipe for controlling the deposition/etching ratio in reaction so as to form the polymer layers 47 on the side walls and top walls of the material layers 45.

Figure 8:
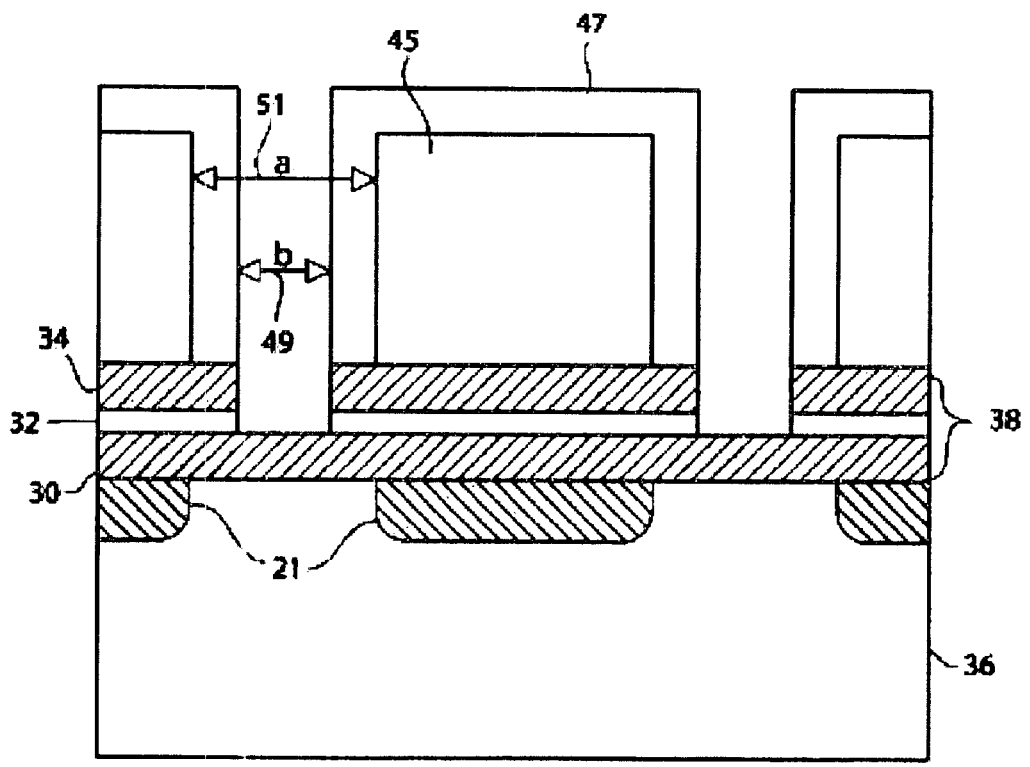
FIG. 8 is a cross-sectional view of FIG. 7 after a subsequent etch processing step.

The polymer layer 47 performs the function of an etching mask, preventing the underlying layers from being removed during subsequent etch back of the second oxide layer 34 and the nitride layer 32. The etching rate ratio between the second oxide layer 34 and the nitride layer 32 is preferably greater than 25:1, and the etching rate ratio between the nitride layer 32 and the first oxide layer 30 is preferably greater than 10:1. As illustrated in FIG. 8, exposed regions of the second oxide layer 34 and nitride layer 32 are completely removed by the etch process, leaving an exposed first oxide layer 30.

Figure 9:
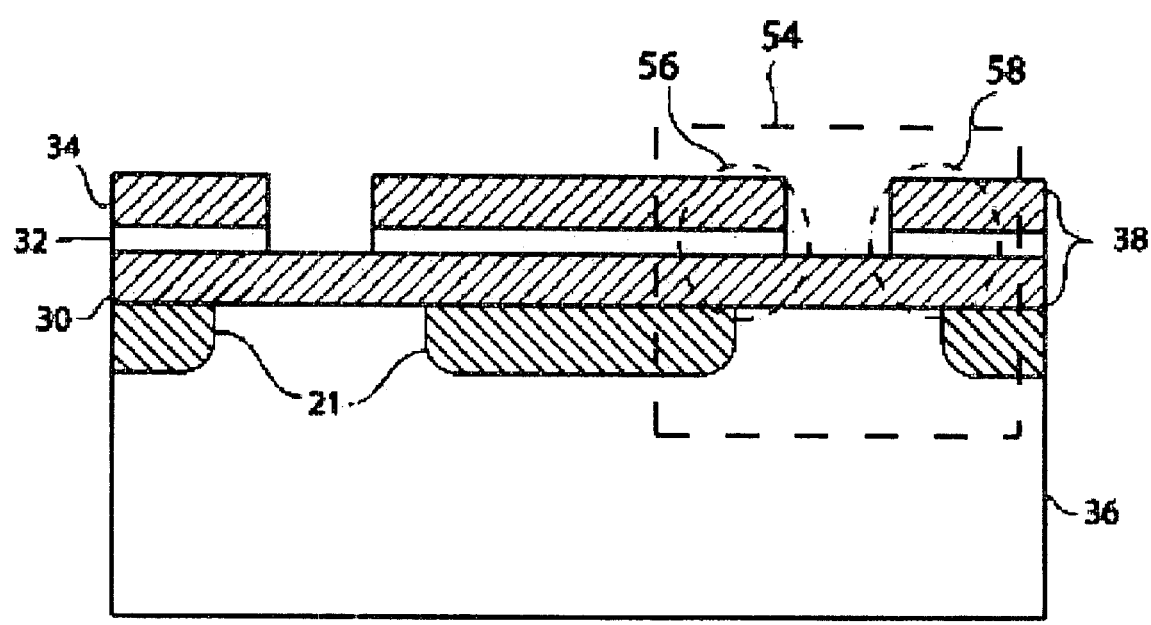
FIG. 9 is a cross-sectional view of FIG. 8 after the polymer layer and material layer have been removed.

With reference to FIG. 9, the polymer layer 47 and the material layer 45 are thereafter removed. This removal may be accomplished, for example, by using ashing and/or solvents to dissolve, and flush away, the polymer layer 47 and the material layer 45. Other known and suitable removal techniques may also be used to remove the polymer layer 47 and the material layer 45. The nitride layer 32 of the ONO stack 38 in each cell 54 (shown in phantom) has been split into two separated bits per cell, herein referred to as a first bit 56 and a second bit 58.

Figure 10:
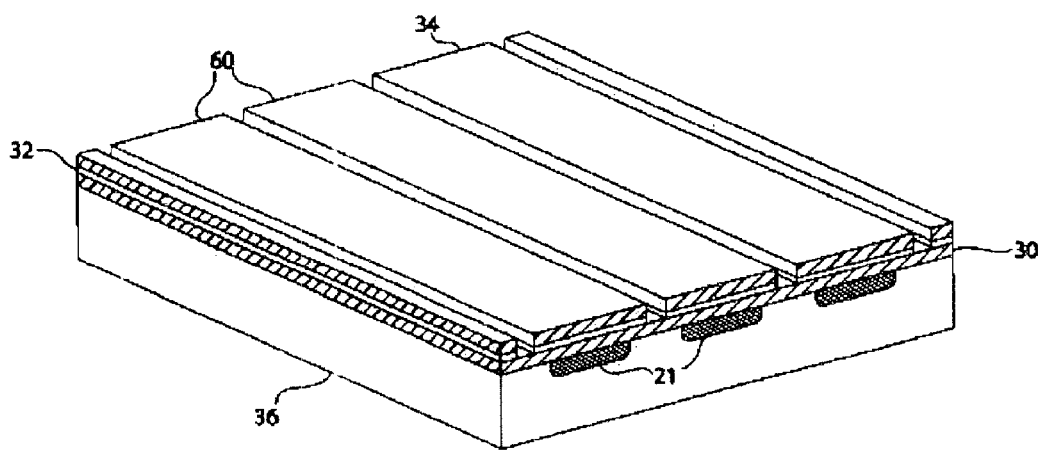
FIG. 10 is a perspective view showing the NROM device at the same processing stage as shown in FIG. 9.

Thus, the ONO stack 38 is patterned to form a plurality of oxide-nitride (ON) strips (i.e., trapping layer strips) over the first oxide layer 30. As can be seen in the perspective view of FIG. 10, each of the plurality of ON strips 60 lies above and overlaps a corresponding bit line 21. Thus, a plurality of ON strips 60 are formed extending in parallel fashion above the plurality of bit lines 21.

Figure 11:
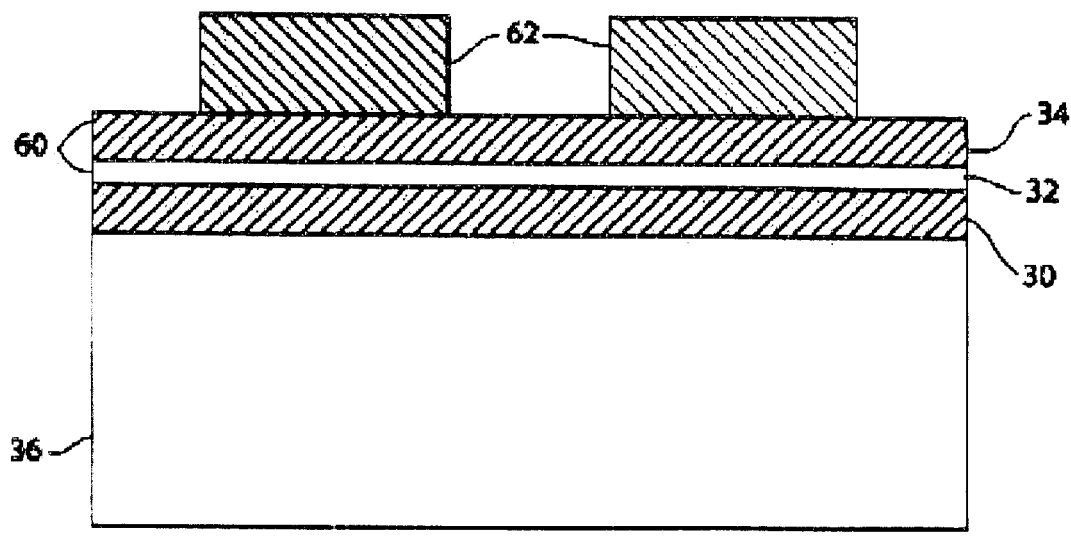
FIG. 11 is a cross-sectional view of an NROM device cut orthogonally to FIGS. 2 through 9 in an intermediate processing stage.

In the cross-sectional view of the NROM device of FIG. 11, which is taken along the line B–B' 27 of FIG. 1, a layer of polysilicon has been deposited over the existing structures and formed into a plurality of word line structures 62. Regarding this formation, a photoresist is applied, patterned, and developed using standard photolithographic techniques, to form a plurality of elongate photoresist structures. The elongate photoresist structures are used to facilitate the etching of the layer of polysilicon to form a plurality of elongate gate or word line structures 62. The word line structures 62 are disposed above corresponding members of the plurality of ON strips 60, which extend orthogonally to the plurality of word line structures 62.

Figure 12:
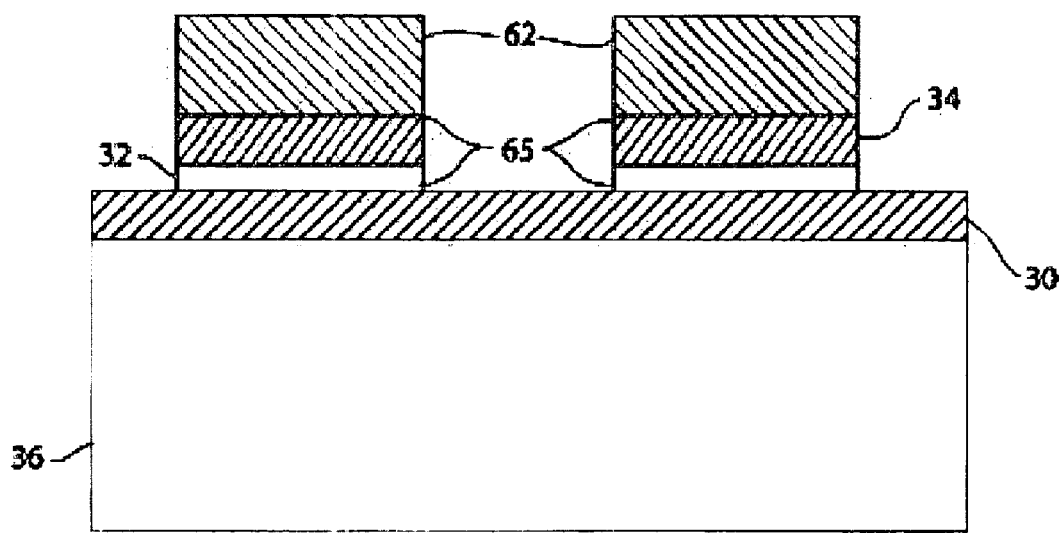
FIG. 12 is a cross-sectional view of the NROM device in FIG. 11 after an etch processing step.

Referring now to FIG. 12, the plurality of ON strips 60 is etched to form a plurality of ON block structures 65. Regarding the etching procedure, the word line structures 62 may act as an etch barrier to protect the underlying layers during the etch processing step. Each of the plurality of word line structures 62 is then preferably centrally disposed above a corresponding member of the plurality of ON block structures 65.

Figure 13:
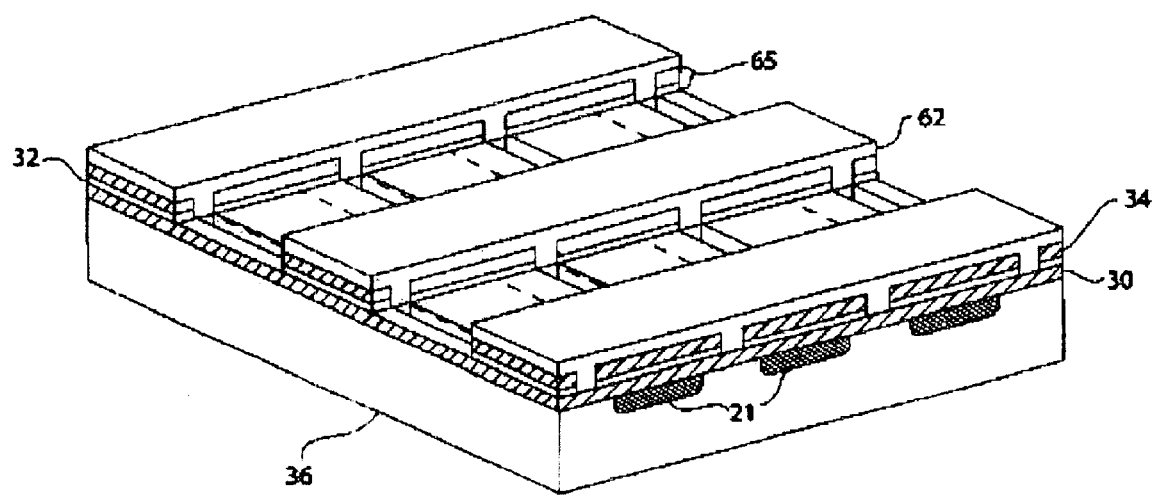
FIG. 13 is a perspective view of an NROM device at the same processing step as FIG. 12.
Figure 14:
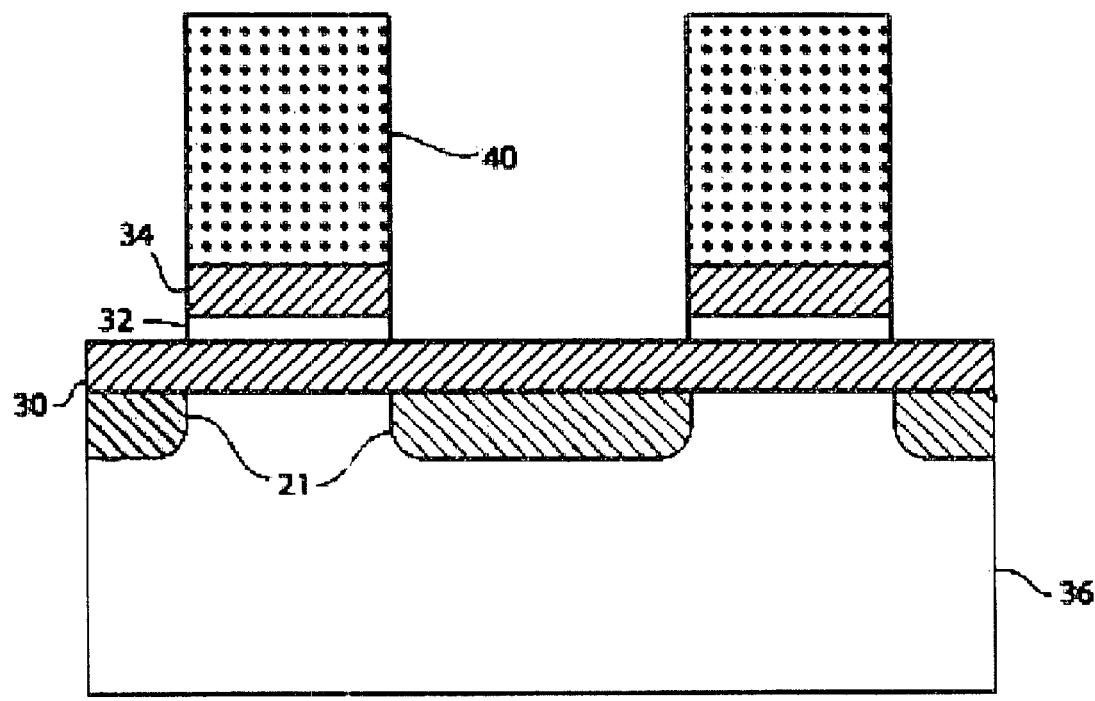
FIG. 14 is a cross-sectional view of the NROM device of FIG. 3 after a subsequent etch processing step.

FIG. 13 is a perspective view elucidating the NROM device shown in FIG. 12. The plurality of bit lines 21 are shown in phantom to extend orthogonally to the plurality of word lines 62. Each intersection of a word line and two corresponding bit lines creates a memory cell, which may contain a first bit 56 and a second bit 58. The ON block structures are separated (i.e., cut apart) from one another in the word line direction at locations between the bit lines 21.

In an alternative embodiment, an ONO stack 38 is formed over a prepared substrate 36 (FIG. 2), followed by a photoresist layer 40 being applied to the ONO stack 38 and a dopant 43 such as arsenic or phosphorus being introduced into exposed portions of the prepared substrate 36 by ion implantation to form a plurality of bit lines 21 (FIG. 3). Proceeding to FIG. 14, an etch step is then performed to remove exposed portions of the second oxide layer 34 and nitride layer 32. Preceding the etch step an optional polymer layer may be formed on surfaces of the photoresist using a dielectric resolution enhancement coating technique as discussed above; and following the etch step the optional polymer layer may be removed or kept in place. Thereafter, a material layer, which may comprise a BARC layer as discussed above, is formed on exposed surfaces of the wafer.

The material layer is then planarized until the photoresist layer 40 is exposed. The photoresist layer 40 (and any remaining optional polymer layer) is/are then removed. Another polymer layer is then formed on the surfaces of the material layer 45 (and on any remaining optional polymer layer) using a dielectric resolution enhancement coating technique as discussed above. Exposed regions of the second oxide layer 34 and nitride layer 32 are etched back and the material layer 45 and polymer layer(s) are subsequently removed. The resulting dual ON strips according to an embodiment wherein the optional polymer are not used, are illustrated in the cross-sectional view of FIG. 15. As depicted, a single cell area 54 (shown in phantom) may contain dual trapping layer strips. The dual trapping layer strips can be used to form a first bit 56 and a second bit 58.

Figure 15:
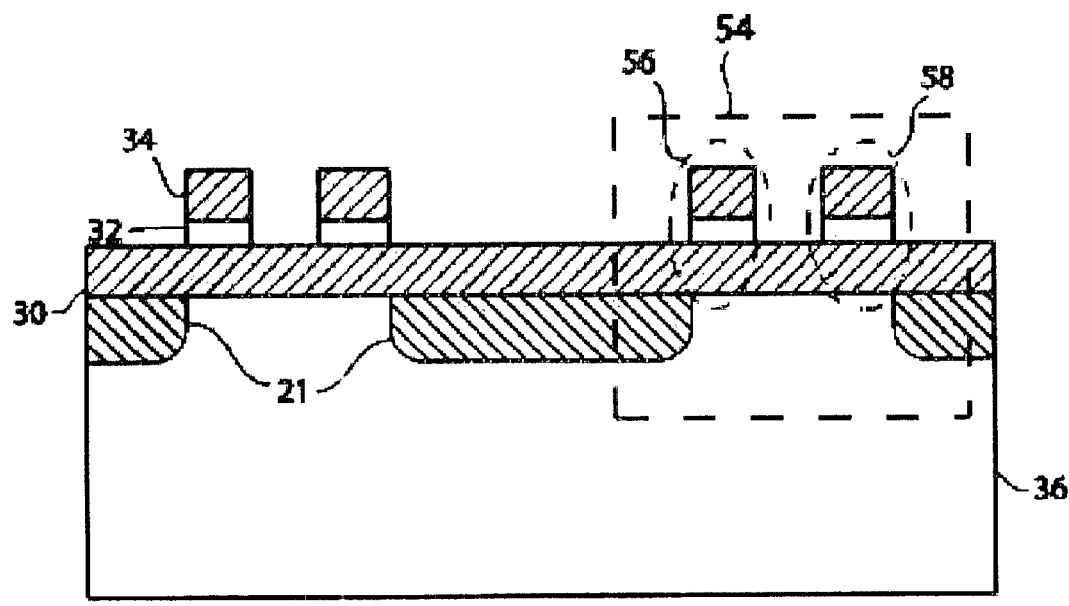
FIG. 15 is a cross-sectional view of another NROM device in an intermediate processing step.

If the optional polymer is used, the dual ON strips would extend over (i.e., overlap) the bit lines 21 in FIG. 15.

Figure 16:
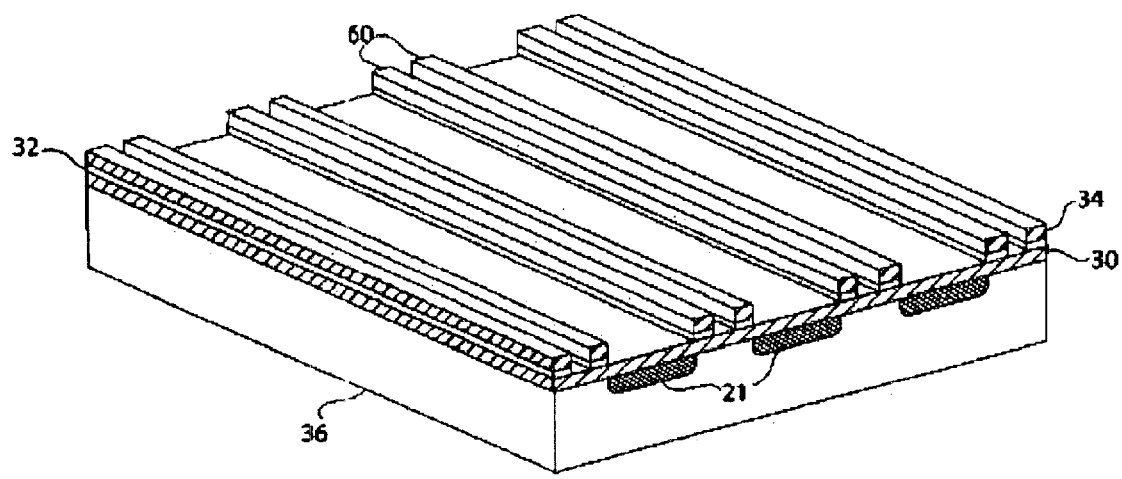
FIG. 16 is a perspective view of an NROM device at the same processing step as shown in FIG. 15.
Figure 17:
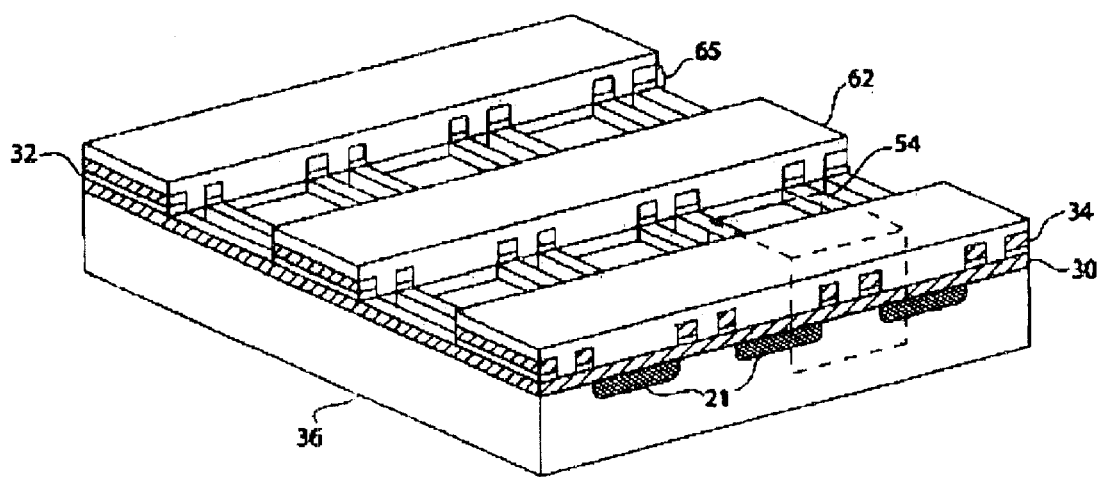
FIG. 17 is a perspective view of the NROM device of FIG. 16 in a processing stage after the word lines have been formed.

FIG. 16 illustrates a perspective view of the NROM device shown in FIG. 15. The ONO stack 38 has been divided into a plurality of dual ON strips 60, each ON strip being disposed in parallel to the plurality of bit lines 21. With reference to FIG. 17, a polysilicon layer is deposited and patterned to form a plurality of word line structures 62 extending orthogonally to the plurality of bit lines 21. Exposed portions of the second oxide layer 34 and nitride layer 32 may then be etched back to form a plurality of ON block structures 65 from the plurality of dual ON strips 60. The ON block structures are separated from one another in the word line direction at locations between the bit lines 21. Each cell 54 (shown in phantom) may comprise two ON block structures 65, each constituting a bit, and occurs at the intersection of a word line and two bit lines.

According to the present invention, the nitride layer 32 of each cell 54 is split or cut apart, to thereby attenuate or avoid cross-talk problems which may be associated with current NROM technologies. In view of the foregoing, it will be understood by those skilled in the art that the methods of the present invention can facilitate formation of operational NROM memory devices in integrated circuits. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Such variations and modifications, however, fall well within the scope of the present invention as set forth in the following claims.

What is claimed is:

1. A nonvolatile memory on a semiconductor substrate, comprising:
    (a) a prepared semiconductor substrate;
    (b) a plurality of bit lines;
    (c) a plurality of trapping layer block structures; and
    (d) a plurality of word lines over corresponding members of the plurality of trapping layer block structures, wherein the trapping layer block structures are separated from one another in the word line direction at locations between the bit lines.

2. The nonvolatile memory of claim 1, wherein the plurality of trapping layer block structures comprises an oxide layer and a nitride layer.

3. The nonvolatile memory of claim 2, wherein:
    the oxide layer comprises a second oxide layer; and
    a first oxide layer extends between the trapping layer block structures in the locations between the bit lines.

4. The nonvolatile memory of claim 1, wherein each trapping layer block structure corresponds to a single bit in a memory cell.

* * * * *